(12) United States Patent
Kanbe

(10) Patent No.: US 8,451,359 B2
(45) Date of Patent: May 28, 2013

(54) SOLID-STATE IMAGE CAPTURING APPARATUS, DRIVING METHOD THEREOF AND ELECTRONIC APPARATUS

(75) Inventor: Hideo Kanbe, Kanagawa (JP)

(73) Assignee: Sony Corporation, Tokyo (JP)

(*) Notice: Subject to any disclaimer, the term of this patent is extended or adjusted under 35 U.S.C. 154(b) by 656 days.

(21) Appl. No.: 12/654,656

(22) Filed: Dec. 29, 2009

(65) Prior Publication Data
US 2010/0188547 A1 Jul. 29, 2010

(30) Foreign Application Priority Data
Jan. 26, 2009 (JP) .................................. 2009-014562

(51) Int. Cl.
*H04N 3/14* (2006.01)
(52) U.S. Cl.
USPC .......................................... 348/302; 348/296
(58) Field of Classification Search
USPC ................. 348/294, 296, 302, 308, 311, 315, 348/317, 320, 322
See application file for complete search history.

(56) References Cited

U.S. PATENT DOCUMENTS
2007/0103575 A1* 5/2007 Kanbe ........................... 348/311

FOREIGN PATENT DOCUMENTS

| JP | 04-280679 A | 10/1992 |
|---|---|---|
| JP | 09-213925 A | 8/1997 |
| JP | 09-266296 | 10/1997 |
| JP | 2003-332556 A | 11/2003 |
| JP | 2004-228328 | 8/2004 |
| JP | 2004-363132 A | 12/2004 |
| JP | 2005-209673 A | 8/2005 |
| JP | 2006-108609 A | 4/2006 |
| JP | 3885769 | 12/2006 |

OTHER PUBLICATIONS

Japanese Office Action issue Jan. 12, 2011 for Japanese Application No. 2009-014562.

* cited by examiner

*Primary Examiner* — Timothy J Henn
(74) *Attorney, Agent, or Firm* — Rader, Fishman & Grauer PLLC

(57) ABSTRACT

A solid-state image capturing apparatus includes: a plurality of light sensing units; a plurality of vertical transfer registers including a transfer channel region and a plurality of vertical transfer electrodes; and a first channel stop region provided in parallel to the transfer channel region of the vertical transfer register. Among the vertical transfer electrodes, a vertical transfer electrode serving as a reading electrode is formed without overlapping the first channel stop region.

19 Claims, 14 Drawing Sheets

000
SOLID-STATE IMAGE CAPTURING APPARATUS, DRIVING METHOD THEREOF AND ELECTRONIC APPARATUS

BACKGROUND OF THE INVENTION

1. Technical Field

The present invention relates to a CCD (Charge Coupled Device) type solid-state image capturing apparatus, a driving method thereof, and an electronic apparatus, such as a camera, provided with the solid-state image capturing apparatus.

2. Description of the Related Art

As a solid-state image capturing apparatus, a charge coupled device (CCD) type solid-state image capturing apparatus has been well known in the related art. According to the CCD type solid-state image capturing apparatus (hereinafter, referred to as a CCD solid-state image capturing apparatus), a plurality of light sensing units, each including a photoelectric conversion unit (i.e., a photodiode) for generating signal charges corresponding to the amount of received light and accumulating the signal charges, are two-dimensionally arranged in a matrix formation. Signal charges are generated based on light signals of an object, which are incident into the photodiodes of the plurality of light sensing units, and then accumulated. The signal charges are transferred in the vertical direction by a plurality of vertical transfer registers having a CCD structure, which are arranged in each column of the light sensing units, and also transferred in the horizontal direction by horizontal transfer registers having a CCD structure. Then, the signal charges transferred in the horizontal direction are output from an output unit having a charge/voltage conversion section as image information of the object. The output unit, typically, includes a floating diffusion (FD) and a source follower amplifier which is connected to end terminals of the horizontal transfer registers, that is, a floating diffusion type amplifier. In addition, the output unit may include a floating gate type amplifier.

In the CCD solid-state image capturing apparatus, a so called interline transfer (IT) scheme has been well known in the related art, which transfers charges by using an image capturing area, which includes the plurality of light sensing units arranged in a two-dimensional matrix formation and the plurality of vertical transfer registers, and the horizontal transfer registers connected to the plurality of vertical transfer registers. Further, in the CCD solid-state image capturing apparatus, a so called frame interline transfer (FIT) scheme has been well known in the related art, which transfers charges by using the image capturing area, a storage section including a plurality of vertical transfer registers, and horizontal transfer registers connected to the plurality of vertical transfer registers of the storage section.

The CCD solid-state image capturing apparatus, for example, has been extensively used for digital still cameras, digital video cameras or the like. Further, the CCD solid-state image capturing apparatus is used as a solid-state image capturing apparatus which is mounted on mobile apparatuses such as phones provided with cameras or PDAs (Personal Digital Assistants).

According to a CCD solid-state image capturing apparatus of the related art, a plurality of vertical transfer electrodes of a vertical transfer register are formed by a bi-layer polysilicon film in such a manner that vertical transfer electrodes of a first layer polysilicon film partially overlap vertical transfer electrodes of a second layer polysilicon film. Such a CCD solid-state image capturing apparatus has a structure in which all vertical transfer electrodes, including a vertical transfer electrode to which a reading voltage VT is applied, extend to channel stop regions provided in parallel to a channel region of the vertical transfer register. The vertical transfer electrode, to which the reading voltage VT is applied, serves as a so called reading electrode.

Meanwhile, as a CCD solid-state image capturing apparatus, a solid-state image capturing apparatus, in which a plurality of vertical transfer electrodes arranged in the transfer direction are formed by a single layer (i.e., an identical layer) polysilicon film, has also been used in the related art. FIGS. 13 and 14 are views illustrating one example of an existing CCD solid-state image capturing apparatus in which a plurality of vertical transfer electrodes are formed by a single layer polysilicon film. FIG. 13 is a plan view illustrating main elements of an image capturing region and FIG. 14 is a sectional view taken along line XIV-XIV of FIG. 13. In FIGS. 13 and 14, only the main elements are shown while other elements are omitted, for example, a light blocking layer, a color filter, an on chip lens or the like which are all above the transfer electrodes.

As shown in FIG. 13, in the CCD solid-state image capturing apparatus 100, photodiodes (PDs) serving as light sensing units 101 having a rectangular shape are two-dimensionally arranged in a matrix formation, and vertical transfer registers 102 having a CCD structure are disposed corresponding to columns of the light sensing units 101. The vertical transfer registers 102 read signal charges from the light sensing units 101, and then transfer the signal charges in the vertical direction. Each vertical transfer register 102 includes an embedded transfer channel region 103, and the plurality of vertical transfer electrodes formed above the transfer channel region 103 while interposing a gate insulating layer therebetween. In the example, three vertical transfer electrodes correspond to the photodiode (PD) serving as one light sensing unit 101, that is, the plurality of vertical transfer electrodes 104 to 106 are formed by a single layer, that is, a first layer polysilicon film. Vertical transfer electrodes are held in common in both the upper and lower vertical transfer electrodes 104 and 106 and upper and lower unit pixels thereof.

The vertical transfer electrodes 104 and 106 are continuously formed in the horizontal direction through between the light sensing units 101, which are adjacent to each other in the vertical direction, such that electrodes corresponding to the vertical transfer registers 102 are connected to each other. Meanwhile, among the three vertical transfer electrodes 104 to 106, the central vertical transfer electrode 105 serves as a reading electrode. Since the vertical transfer electrode 105 serving as the reading electrode is independently formed in an island shape, the vertical transfer electrode 105 is connected through a connection interconnection 107 formed by a second layer polysilicon film. The connection interconnection 107 includes a band-shaped section 107B disposed on the vertical transfer electrodes 104 and 106, which extend between the light sensing units 101 adjacent to each other in the vertical direction, while interposing an insulating layer therebetween, and an extension section 107A extending above the vertical transfer electrode 105 while being integrally formed with the band-shaped section 107B. The extension section 107A is connected to a contact section 108 of the vertical transfer electrode 105 in each vertical transfer register 102.

The embedded transfer channel region 103 is formed in a linear shape in the vertical direction. In order to be provided in parallel to the embedded transfer channel region 103 while making contact with the embedded transfer channel region 103, a first channel stop region 111 for separating pixels adjacent to each other in the horizontal direction is formed in a linear shape between the pixels adjacent to each other in the horizontal direction. Further, a second channel stop region 112 for separating pixels adjacent to each other in the vertical direction is formed between the pixels adjacent to each other in the vertical direction. The second channel stop region 112 includes a horizontal region between the pixels adjacent to each other in the vertical direction, and a region which vertically extends toward the light sensing unit 101 while partially making contact with the embedded transfer channel region 103. The first and second channel stop regions 111 and 112 are formed by a semiconductor region which contains impurities, for example, a p type semiconductor region.

The vertical transfer electrodes 104 to 106 are formed over the first and second channel stop regions 111 and 112.

When viewed in the sectional view, as shown in FIG. 14, a second conductive type (e.g., a p type) first semiconductor well region 116 is formed on a first conductive type (e.g., an n type) semiconductor substrate 115, and the photodiode (PD) serving as the light sensing unit 101 is formed in the p type first semiconductor well region 116. The photodiode (PD) includes an n type semiconductor region 117 and a p+ type semiconductor region 118 that controls dark current. The p type first semiconductor well region 116 includes the n type embedded transfer channel region 103, the first p+ channel stop region 111, and the second p+ channel stop region 112 (not shown). A p type second semiconductor well region 119 is formed immediately below the embedded transfer channel region 103.

The respective corresponding vertical transfer electrodes 104 to 106 are formed above the embedded transfer channel region 103, a charge reading gate section 121 and the first p+ channel stop region 111 while interposing a gate insulating layer (e.g., a silicon oxide layer 122). In FIG. 13, the vertical transfer electrode 105 serving as the reading electrode is formed.

In the above-described CCD solid-state image capturing apparatus in which the vertical transfer electrodes are formed by the bi-layer polysilicon film, the configuration, in which all the vertical transfer electrodes extend onto the channel stop region, is due to the following reasons. The first reason is to ensure a design margin resulting from a mask alignment error of the channel region of the vertical transfer register and the vertical transfer electrode.

Further, as shown in FIG. 15, vertical transfer electrodes 131 and 133 formed by a first layer polysilicon film and a vertical transfer electrode 132 formed by a second layer polysilicon film are arranged in the transfer direction while overlapping each other. A recess 134 of a pattern at the overlapped part of the vertical transfer electrodes 131 to 133 may easily occur in the second layer polysilicon film which is the vertical transfer electrode 132 to which a reading voltage VT is applied. The recess 134 occurs because the thickness or width of a resist pattern serving as a mask in the vicinity of a stepped portion is not uniform in a photolithography process due to the influence of the stepped portion at the overlapped part, and an electrode width varies somewhat when viewed in a plan view. The second reason is to prevent exposure of a channel region 135 due to the recess pattern by setting the electrode width to be thick. When the vertical transfer electrode 132 formed by the second layer polysilicon film is drawn by a line overlapping the channel region 135, a part of the underlying channel region 135 is exposed by the recess 134. In a state in which the vertical transfer electrode is not relatively largely covered by the channel region 135, the potential at the portion becomes deeper, so that a problem may occur in charge transfer.

When a pixel cell is not fine, a gate insulating layer is formed to have a certain thickness, and an impurity concentration of a channel stop region is not high, even if the vertical transfer electrode, to which the reading voltage VT is applied, is formed to extend onto the channel stop region, a problem may not significantly be obvious. This corresponds to another reason.

Meanwhile, even in a CCD solid-state image capturing apparatus in which the plurality of vertical transfer electrodes as shown in FIGS. 13 and 14 are formed by a single layer polysilicon film, the plurality of vertical transfer electrodes extend onto the channel stop region 111 by reasons similar to the above-described reasons. That is, in the related art, the necessity of removing the overlapping of the channel stop regions 111 and 112 and the vertical transfer electrodes 104 to 106 is not recognized. That is, even if the channel stop regions 111 and 112 overlap the vertical transfer electrodes 104 to 106, a problem may not be obvious.

As prior literatures, Japanese Patent No. 3885769, Japanese Unexamined Patent Application Publication No. 9-266296 and Japanese Unexamined Patent Application Publication No. 2004-228328 are described. Japanese Patent No. 3885769 discloses a configuration in which the width of a vertical transfer electrode is substantially identical to the width of a transfer channel region. With such a configuration, as compared with an existing solid-state image capturing apparatus, a region (i.e., a canopy section in light blocking) of a portion, which does not exist on the vertical transfer electrode, is widened during the light blocking, and smear characteristics varying depending on the length of a canopy section can be improved.

Japanese Unexamined Patent Application Publication No. 9-266296 discloses a configuration in which, immediately below an n type embedded transfer channel of a vertical transfer register, a p type semiconductor region having a low impurity concentration is formed at the center portion thereof, and p type semiconductor regions having a high impurity concentration are formed at both sides thereof. With such a configuration, the smear is reduced, and a fringing electric field of charge transfer at the center portion of the transfer channel region is increased, so that transfer efficiency is ensured. In the sectional structure of the drawing, a vertical transfer electrode serving as a reading electrode does not extend onto a p+ element isolation layer, but there is no special implication.

Japanese Unexamined Patent Application Publication No. 2004-228328 discloses a configuration in which a vertical transfer electrode formed by a bi-layer polysilicon film is provided, and a vertical transfer electrode formed by a first layer polysilicon film is formed in a recess of a substrate surface. A part of the vertical transfer electrode formed by the first layer polysilicon film is formed over a channel stop portion. If the vertical transfer electrode is formed in the substrate recess, since an upper surface of a unit cell is planarized before the formation of the polysilicon film, which becomes the vertical transfer electrode of the second layer, a process of forming the vertical transfer electrode is simplified.

As described above, in a CCD solid-state image capturing apparatus in which a pixel size is not relatively fine, even if a vertical transfer electrode overlaps a channel stop region, no problem occurs. That is, in an existing structure in which a gate insulating layer is relatively thick and the impurity concentration of the channel stop region and embedded transfer channel region is not relatively high, so long as the reading voltage VT is not excessively increased, even if the channel stop region overlaps the vertical transfer electrode, no problems occur.

SUMMARY OF THE INVENTION

However, recently, in the CCD solid-state image capturing apparatus, as the size of a pixel cell becomes small with the tendency of a multi-pixel structure and high resolution, charge transfer characteristics may be degraded due to a region in which a channel stop region overlaps a vertical transfer electrode, and the SN ratio may be reduced due to the increase in dark current. Even in the CCD solid-state image capturing apparatus in which the vertical transfer electrodes 104 to 106 are formed by a single layer polysilicon film as shown in FIGS. 13 and 14, there exists a region (indicated by an oblique line) 114 in which the vertical transfer electrode 105 serving as the reading electrode overlaps the channel stop regions 111 and 112. Even in such a CCD solid-state image capturing apparatus, the above-described problem can be predicted. That is, as the size of a pixel cell becomes small, the gate insulating layer of the vertical transfer register is set to about 30 nm and the acceptor concentration of the channel stop region is set to about $1 \times 10^{17}$ cm$^{-3}$. With such a configuration, if the reading voltage VT having a value of about 10 or more volts is applied, a local strong electric field is generated between the vertical transfer electrode serving as the reading electrode and the channel stop regions. Due to the local strong electric field, there occurs trap assisted band to band tunneling, which does not occur in the related art. Due to the trap assisted band to band tunneling, it is possible to estimate transfer degradation due to the gush of a minority carrier and the injection/trapping of the minority carrier to the gate insulating layer by electric field acceleration. Further, if electrons are injected into the gate insulating layer, it has been generally known that the interface state of Si substrate-SiO$_2$ layer interface increases, which results in a reduction of the SN ratio of the solid-state image capturing apparatus with the increase in dark current.

In view of the above issues, it is desirable to provide a solid-state image capturing apparatus, which can prevent degradation of properties of the solid-state image capturing apparatus due to application of a reading voltage even if the size of a pixel cell becomes small, a driving method thereof, and an electronic apparatus, such as a camera, provided with the same.

According to an embodiment of the invention, there is provided a solid-state image capturing apparatus including a plurality of light sensing units, a plurality of vertical transfer registers including a transfer channel region and a plurality of vertical transfer electrodes, and a first channel stop region provided in parallel to the transfer channel region of the vertical transfer register. In the invention, among the vertical transfer electrodes, a vertical transfer electrode serving as a reading electrode is formed which does not overlap the first channel stop region.

In the solid-state image capturing apparatus of the invention, among the plurality of vertical transfer electrodes of the vertical transfer register, the vertical transfer electrode serving as the reading electrode is formed so that it does not overlap the first channel stop region. With such a configuration, even if the size of a pixel cell becomes small, upon the application of the reading voltage, electric field concentration between an edge portion of the vertical transfer electrode and the channel stop region is alleviated. Thus, the injection of electrons into a gate, insulating layer is prevented, and potential modulation of the transfer channel region is prevented. Further, punch through of a depletion layer between a transfer section below the vertical transfer electrode, to which the reading voltage is applied, and the light sensing unit of adjacent pixels is prevented.

A driving method of the solid-state image capturing apparatus according to the invention uses the solid-state image capturing apparatus in which one of the plurality of vertical transfer electrodes of the vertical transfer register, to which the reading voltage is applied, is formed so that it does not overlap the channel stop region provided in parallel to the transfer channel region. In the solid-state image capturing apparatus, a local electric field between an edge portion of the vertical transfer electrode, to which the reading voltage is applied, and the channel stop region is set to be equal to or less than 60 V/μm, the local electric field being induced by thickness of a gate insulating layer of the vertical transfer register and the reading voltage. Then, signal charges from the light sensing unit to the vertical transfer register are read by applying the reading voltage to the vertical transfer electrode.

According to the driving method of the solid-state image capturing apparatus of the invention, when the local electric field between the edge portion of the vertical transfer electrode of the vertical transfer register, to which the reading voltage is applied, and the channel stop region is equal to or less than 60 V/μm, the signal charges are read from the light sensing unit to the vertical transfer register. Since the local electric field is equal to or less than 60 V/μm, even if the size of a pixel cell becomes small, the local electric field, that is, electric field concentration is alleviated. Thus, electron injection into the gate insulating layer and potential modulation of the transfer channel region are prevented. The channel stop region does not overlap the vertical transfer electrode serving as the reading electrode, so that punch through of a depletion layer to the light sensing unit of adjacent pixels is prevented.

An electronic apparatus according to the invention includes an optical lens, a solid-state image capturing apparatus, and a signal processing circuit that processes an output signal of the solid-state image capturing apparatus. The solid-state image capturing apparatus includes a plurality of light sensing units, a plurality of vertical transfer registers including a transfer channel region and a plurality of vertical transfer electrodes, and a first channel stop region provided in parallel to the channel region of the vertical transfer register. Among the vertical transfer electrodes, a vertical transfer electrode serving as a reading electrode is formed so that it does not overlap the first channel stop region.

According to the solid-state image capturing apparatus and the driving method thereof based on the invention, even if the size of a pixel cell becomes small, the characteristics of the solid-state image capturing apparatus can be prevented from being degraded by the application of the reading voltage.

According to the electronic apparatus of the invention, since the solid-state image capturing apparatus is provided, even if the size of a pixel cell becomes small, the characteristics of the solid-state image capturing apparatus can be prevented from being degraded by the application of the reading voltage and a high quality electronic apparatus can be provided.

DESCRIPTION OF THE PREFERRED EMBODIMENTS

Hereinafter, preferred embodiments of the invention (hereinafter, referred to as embodiments) will be described with reference to the accompanying drawings. Furthermore, the description will be given in order of the following items.

1. First Embodiment (Configuration example of Solid-state image capturing apparatus)
2. Second Embodiment (Configuration example of Solid-state image capturing apparatus)
3. Third Embodiment (Configuration example of Solid-state image capturing apparatus)
4. Fourth Embodiment (Configuration example of Solid-state image capturing apparatus)
5. Fifth Embodiment (Configuration example of Electronic apparatus)

Figure 1:
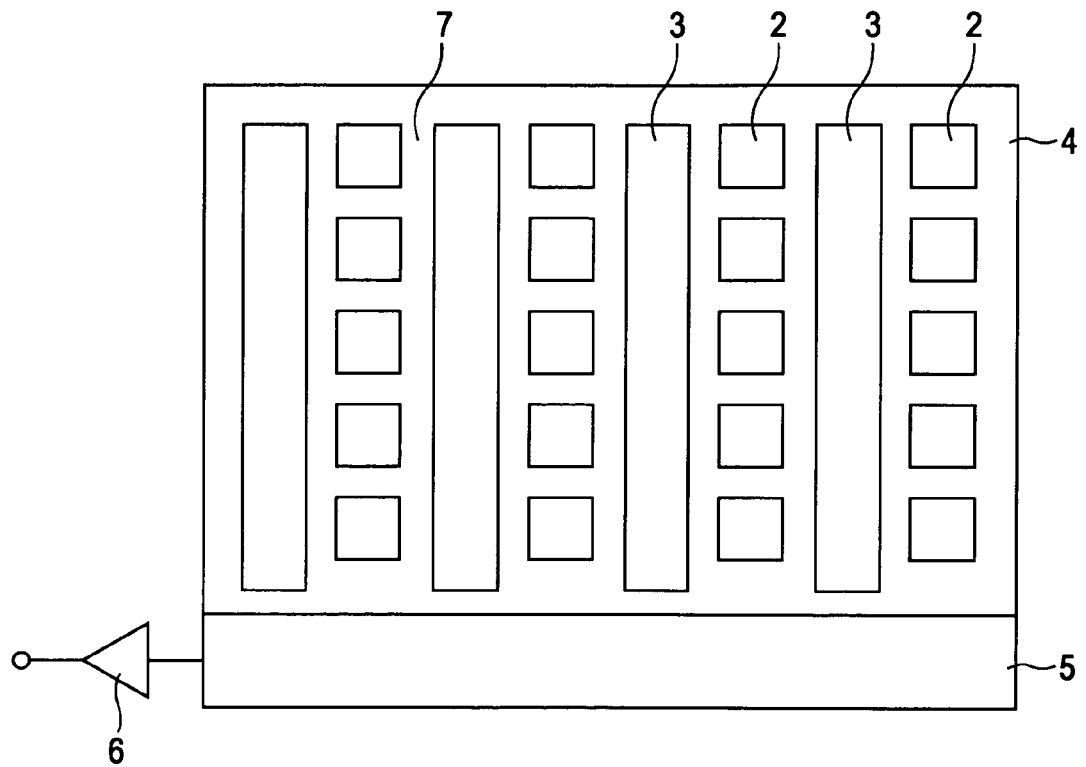
FIG. 1 is a plan view illustrating an outline of an interline transfer (IT) type solid-state image capturing apparatus applied to the invention.
Figure 2:
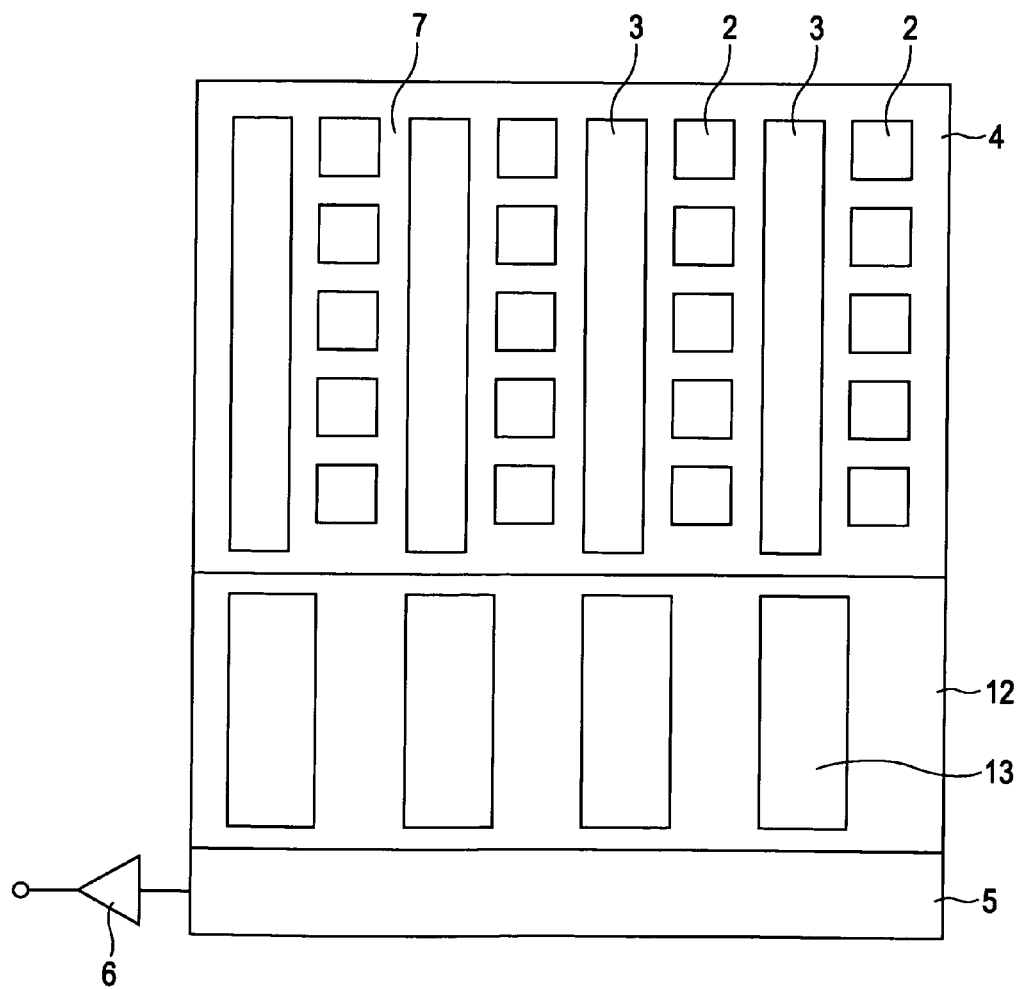
FIG. 2 is a plan view illustrating an outline of a frame interline transfer (FIT) type solid-state image capturing apparatus applied to the invention.

FIGS. 1 and 2 are schematically views illustrating the configuration of a solid-state image capturing apparatus to which the invention is applied, that is, an interline transfer (hereinafter, referred to as an IT) type CCD solid-state image capturing apparatus and a frame interline transfer (hereinafter, referred to as an FIT) type CCD solid-state image capturing apparatus.

As shown in FIG. 1, the IT type CCD solid-state image capturing apparatus 1 includes a plurality of light sensing units 2 two-dimensionally arranged in a matrix formation, an image capturing region 4 in which vertical transfer registers 3 having a CCD structure are arranged corresponding to columns of each light sensing unit, and a horizontal transfer register 5 having a CCD structure. Further, an output unit 6 including a charge/voltage conversion section is connected to an end of the horizontal transfer register 5. The output unit 6, for example, includes a floating diffusion (FD) and a source follower amplifier, that is, a floating diffusion type amplifier. In addition, the output unit 6 may include a floating gate type amplifier.

According to the IT type CCD solid-state image capturing apparatus 1, in the light sensing units 2, signal charges corresponding to the amount of received light are generated, and then accumulated. A reading gate voltage VT is applied to a reading gate unit 7, so that the signal charges of the light sensing units 2 are read by the vertical transfer registers 3. After the signal charges are read by the vertical transfer registers 3, a vertical driving pulse is applied to vertical transfer electrodes, so that the signal charges in the vertical transfer registers 3 are sequentially transferred one line at a time toward the horizontal transfer register 5. After the signal charges are transferred one line at a time from the vertical transfer registers 3 to the horizontal transfer register 5, a horizontal driving pulse is applied to horizontal transfer electrodes, so that the signal charges are sequentially transferred in the horizontal transfer register 5 and output through the output unit 6 as a pixel signal.

As shown in FIG. 2, the FIT type CCD solid-state image capturing apparatus 11 includes the plurality of light sensing units 2 two-dimensionally arranged in a matrix formation, the image capturing region 4 in which the vertical transfer registers 3 are arranged corresponding to columns of each light sensing unit, a storage region 12 and a horizontal transfer register 5. The vertical transfer registers 3 and the horizontal transfer register 5 have a CCD structure. The storage region 12 includes only vertical transfer registers 13 having a CCD structure, which correspond to the number of the vertical transfer registers 3 in the image capturing region 4. Similarly to the IT type CCD solid-state image capturing apparatus 1, the output unit 6 including the charge/voltage conversion section is connected to the end of the horizontal transfer register 5.

According to the FIT type CCD solid-state image capturing apparatus 11, in the light sensing units 2, signal charges corresponding to the amount of received light are generated, and then accumulated. The reading gate voltage VT is applied to the reading gate unit 7, so that the signal charges of the light sensing units 2 are read by the vertical transfer registers 3. After the signal charges are read by the vertical transfer registers 3, a vertical driving pulse of high speed transfer is applied to both vertical transfer electrodes of the vertical transfer registers 3 in the image capturing region 4 and vertical transfer electrodes of the vertical transfer registers 13 in the storage region 12. Thus, the signal charges read by the vertical transfer registers 3 of the image capturing region 4 are transferred at a high speed and accumulated in the vertical transfer registers 13 of the storage region 12. Thereafter, a constant speed vertical driving pulse is applied to the vertical transfer electrodes of the vertical transfer registers 13 of the storage region 12, so that the signal charges in the vertical transfer registers 13 are sequentially transferred one line at a time toward the horizontal transfer register 5. After the signal charges are transferred one line at a time from the vertical transfer registers 13 to the horizontal transfer register 5, a horizontal driving pulse is applied to horizontal transfer electrodes, so that the signal charges are sequentially transferred in the horizontal transfer register 5 and output through the output unit 6 as a pixel signal.

In the IT type and the FIT type solid-state image capturing apparatus as described above, the vertical transfer registers can be driven by a four-phase driving pulse. Further, the vertical transfer registers can be driven by a two-phase driving pulse, a three-phase driving pulse, or a four-phase driving pulse or more. In addition, frame reading can also be performed and the signal charges can be read in an interlaced manner. In the interlaced manner, signals of two pixels adjacent to each other at one side of a vertical direction are added and an odd numbered field is read out, and signals of two pixels adjacent to each other at the other side of the vertical direction are added and an even numbered field is read out. The horizontal transfer register, for example, can be driven by a two-phase driving pulse. The horizontal transfer register can be driven by a three or four-phase driving scheme in addition to a two-phase driving scheme.

The following CCD solid-state image capturing apparatuses according to the following embodiments can be applied to both the IT type CCD solid-state image capturing apparatus 1 of FIG. 1 and the FIT type CCD solid-state image capturing apparatus 11 of FIG. 2.

First Embodiment

[Configuration Example of Solid-State Image Capturing Apparatus]

Figure 3:
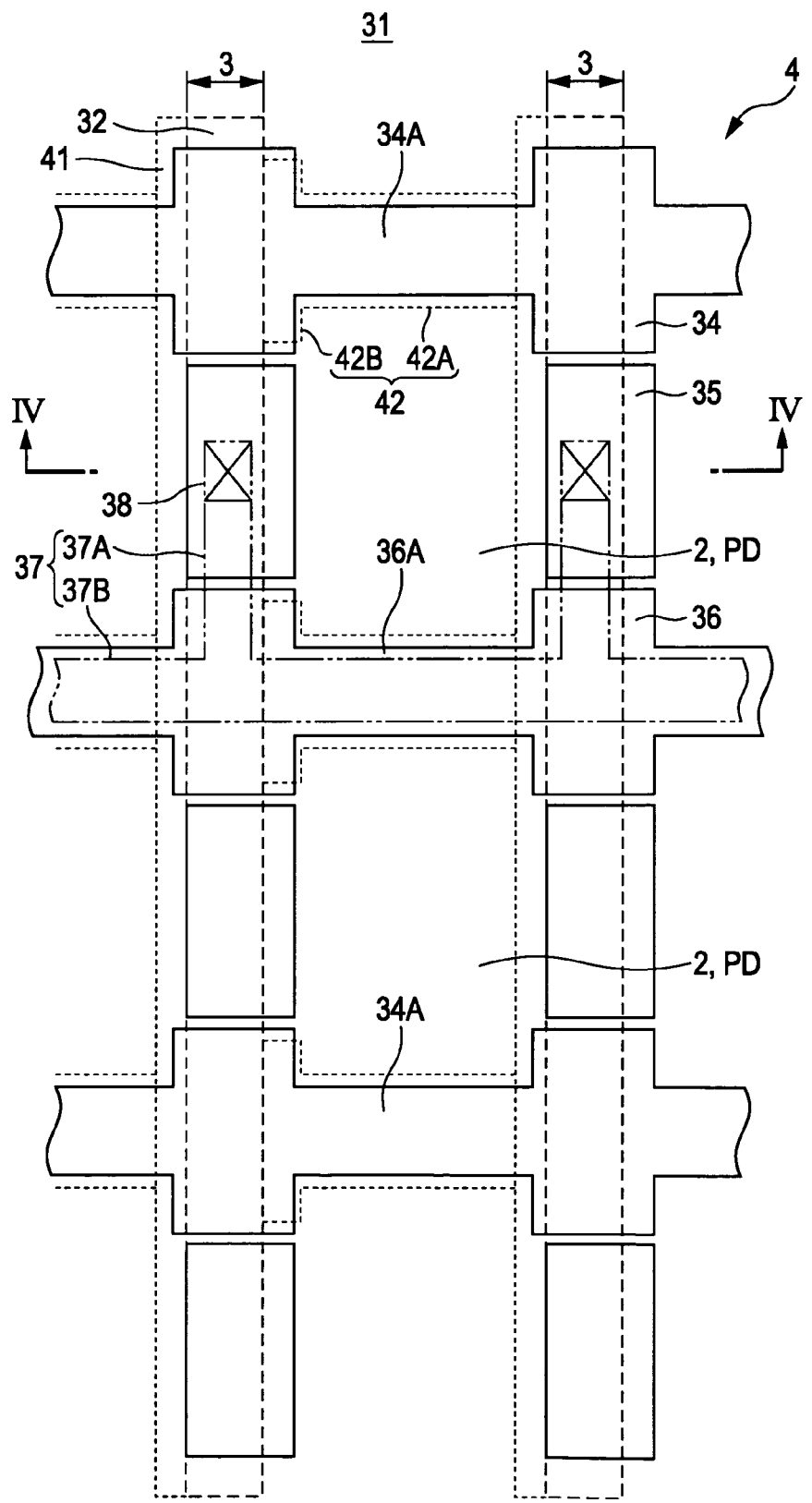
FIG. 3 is a plan view illustrating an outline of main elements of a solid-state image capturing apparatus according to a first embodiment of the invention.
Figure 4:
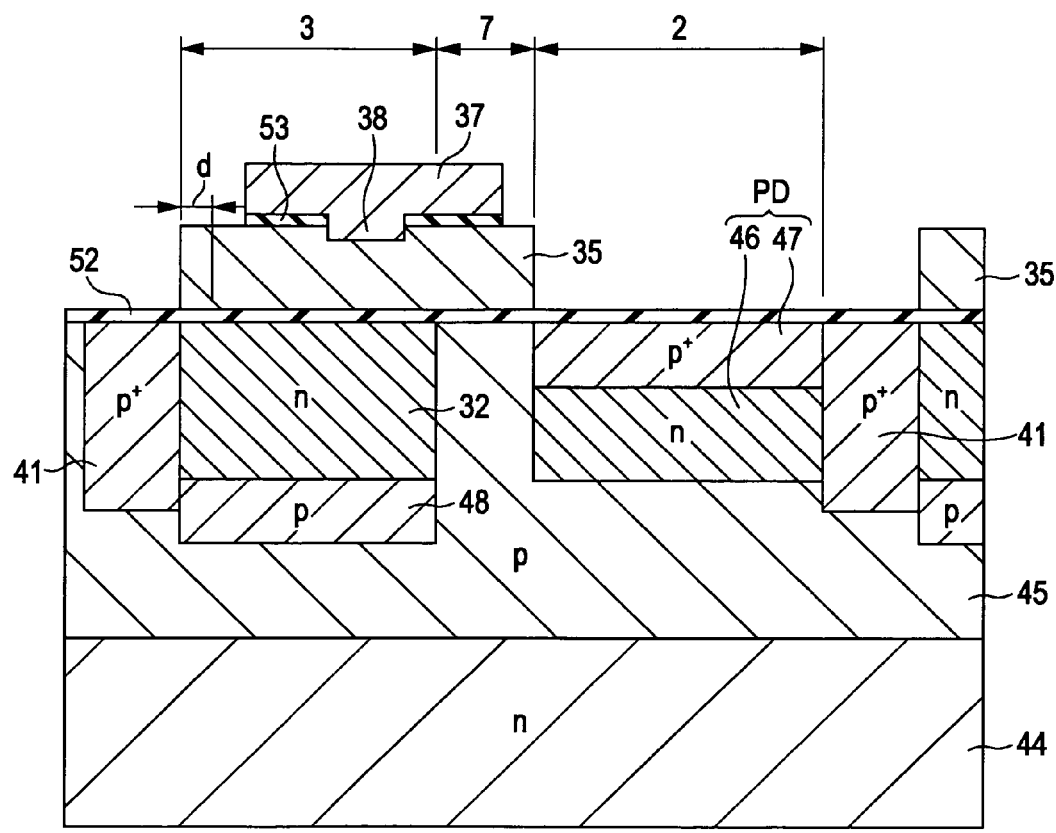
FIG. 4 is a sectional view taken along line IV-IV of FIG. 3.

FIGS. 3 and 4 illustrate a solid-state image capturing apparatus according to an embodiment of the invention, that is, a CCD solid-state image capturing apparatus according to the first embodiment. FIG. 3 is a plan view of main elements in an image capturing region and FIG. 4 is a sectional view taken along line IV-IV of FIG. 3. As shown in FIG. 3, in the solid-state image capturing apparatus 31 according to the embodiment, a pixel unit, that is, an image capturing region 4 includes a plurality of light sensing units 2 which are two-dimensionally arranged in a matrix formation, and a plurality of vertical transfer registers 3 arranged corresponding to columns of each light sensing unit.

Each light sensing unit 2 is formed by a photodiode (PD) serving as a photoelectric conversion unit. One pixel is formed at a portion corresponding to the light sensing unit 2 and the vertical transfer registers 3. Each vertical transfer register 3 includes an embedded transfer channel region 32 and a plurality of vertical transfer electrodes formed above the embedded transfer channel region 32 while interposing a gate insulating layer therebetween. In the embodiment, in order that three vertical transfer electrodes correspond to the photodiode (PD) serving as one light sensing unit 2, a plurality of vertical transfer electrodes 34 to 36, each including a single layer (identical layer), that is, a first layer polysilicon film, are formed. A unit pixel includes one light sensing unit 2 and three upper, lower and middle (central) vertical transfer electrodes 34, 36 and 35. Vertical transfer electrodes are held in common in both the upper and lower vertical transfer electrodes 34 and 36 and upper and lower unit pixels thereof.

Among the three vertical transfer electrodes 34 to 36, the upper and lower vertical transfer electrodes 34 and 36 sandwiching the central vertical transfer electrode 35 are continuously formed in the horizontal direction through connection electrodes 34A and 36A between the light sensing units 2, which are adjacent to in the vertical direction, such that electrodes corresponding to the vertical transfer registers 3 are connected to each other. Meanwhile, among the three vertical transfer electrodes 34 to 36, the central vertical transfer electrode 35 located on a lateral surface of the light sensing unit serves as a reading electrode. Since the vertical transfer electrode 35 serving as the reading electrode is independently formed in an island shape, the vertical transfer electrode 35 is connected through a connection interconnection 37 formed by a second layer polysilicon film.

The connection interconnection 37 includes a band-shaped section 37B disposed on the vertical transfer electrodes 34 and 36, which extend between the light sensing units 2 adjacent to each other in the vertical direction, while interposing an insulating layer therebetween, and an extension section 37A integrally formed with the band-shaped section 37B and extending above the vertical transfer electrode 35 while interposing an insulating layer therebetween. The extension section 37A is connected to a contact section 38 of the vertical transfer electrode 35, which is formed in the island shape, in each vertical transfer register 3.

The embedded transfer channel region 32 is formed in a linear shape in the vertical direction. In order to be provided in parallel to the embedded transfer channel region 32 while making contact with the embedded transfer channel region 32, a first channel stop region 41 for separating pixels adjacent to each other in the horizontal direction is formed in a linear shape between the pixels adjacent to each other in the horizontal direction. Further, a second channel stop region 42 for separating pixels adjacent to each other in the vertical direction is formed between the pixels adjacent to each other in the vertical direction.

The second channel stop region 42 includes a horizontal region 42A between the pixels adjacent to each other in the vertical direction, and a vertical region 42B which vertically extends toward the light sensing unit 2 while partially making contact with the embedded transfer channel region 32. The first and second channel stop regions 41 and 42 are formed by a semiconductor region which contains impurities, for example, a p type semiconductor region.

According to the embodiment of the invention, the vertical transfer electrode 35 serving as the reading electrode is formed to overlap the first channel stop region 41. That is, the vertical transfer electrode 35 can be formed such that a side edge of the vertical transfer electrode 35 with respect to the first channel stop region 41 substantially coincides with the boundary between the first channel stop region 41 and the embedded transfer channel region 32. Otherwise, the vertical transfer electrode 35 can be located above the embedded transfer channel region 32 separated by a dimension corresponding to alignment accuracy from the boundary, for example, the distance d (see FIG. 4) which is less than or equal to 15 nm. Preferably, the vertical transfer electrode 35 is separated from the boundary by less than the distance d.

By using a front end microfabrication process, an alignment error between the embedded transfer channel region 32 and the vertical transfer electrode 35 serving as the reading electrode has a value within the range of 15 nm. Even if the vertical transfer electrode 35 is located inward the embedded transfer channel region 32 by about 15 nm (distance d) from an end edge of the embedded transfer channel region 32, it does not have any influence on formation of a potential well in a transfer section of the vertical transfer register.

A side edge of the vertical transfer electrode 35 with respect to the light sensing unit 2 is formed to coincide with side edges of the vertical transfer electrodes 34 and 36. In the embodiment, the side edges of the vertical transfer electrodes 34 and 36, which do not serve as the reading electrode, with respect to the first channel stop region 41, are formed to overlap the first channel stop region 41.

In addition, in the embodiment, the second channel stop region 42 is formed not to overlap the central vertical transfer electrode 35 serving as the reading electrode. That is, the second channel stop region 42 includes a horizontal region 42A and a vertical region 42B, and the vertical region 42B is formed not to overlap the vertical transfer electrode 35. A second channel stop region including only the horizontal region 42A may be formed without forming the vertical region 42B. However, even in such a case, the vertical transfer electrode 35 does not overlap the horizontal region 42A.

FIG. 4 illustrates a sectional structure on line IV-IV of FIG. 3 which passes through the vertical transfer electrode 35 serving as the reading electrode. According to the sectional structure, as shown in FIG. 4, a second conductive type (e.g., a p type) first semiconductor well region 45 is formed on a first conductive type (e.g., an n type) silicon semiconductor substrate 44, and the photodiode (PD) constituting the light sensing unit 2 is formed in the p type first semiconductor well region 45. The photodiode (PD) includes an n type semiconductor region 46 and a p+ type semiconductor region 47 that controls dark current on the surface. The p type first semiconductor well region 45 includes the n type embedded transfer channel region 32, the first p+ channel stop region 41, and the second p+ channel stop region (not shown). A p type second semiconductor well region 48 is formed immediately below the embedded transfer channel region 32. The p type second semiconductor well region 48 increases the handling charge amount of the vertical transfer register 3, or prevents smearing by suppressing the extent of a depletion layer of the embedded transfer channel region 32.

A gate insulating layer (e.g., a silicon oxide layer) 52 having a uniform thickness, i.e., an identical layer thickness, is formed on a region including the embedded transfer channel region 32, the charge reading gate unit 7 and the p+ channel stop regions 41 and 42. The above-described vertical transfer electrodes 34 to 36 formed by the first layer polysilicon film are formed on the gate insulating layer 52.

Particularly, the vertical transfer electrode 35 is formed above the gate insulating layer 52 over the embedded transfer channel region 32 and the charge reading gate unit 7 such that the vertical transfer electrode 35 does not overlap the first and second p+ channel stop regions 41 and 42. The side edge of the vertical transfer electrode 35 with respect to the first channel stop region 41 exists within the range of the distance d corresponding to alignment accuracy from the first p+ channel stop region 41.

As the size of a pixel cell becomes small, the thickness of the gate insulating layer 52 becomes thinner. Further, the impurity concentration of the n type embedded transfer channel region 32 and the impurity concentration of the p+ channel stop region 41 become higher. For example, in a pixel size of around 2 μm, the thickness of the gate insulating layer is set to about 30 nm to 40 nm. Further, with respect to shrinkage corresponding to 1/m of a pixel, the impurity concentration of the transfer channel region or the channel stop region is set to increase to about $\sqrt{m}$ times or m times.

The connection interconnection 37 is formed via an insulating layer 53 with respect to the vertical transfer electrode 35 independently formed in the island shape, and connected to the vertical transfer electrode 35 through the contact section 38.

Further, although not illustrated in the drawing, a light blocking layer is formed via an insulating layer to cover the vertical transfer electrodes 35 and 36 except for the light sensing unit 2, an on chip color filter is formed via a passivation layer and a planarizing layer, and an on chip micro lens is formed thereon.

[Operation and Driving Method]

Figure 5A:
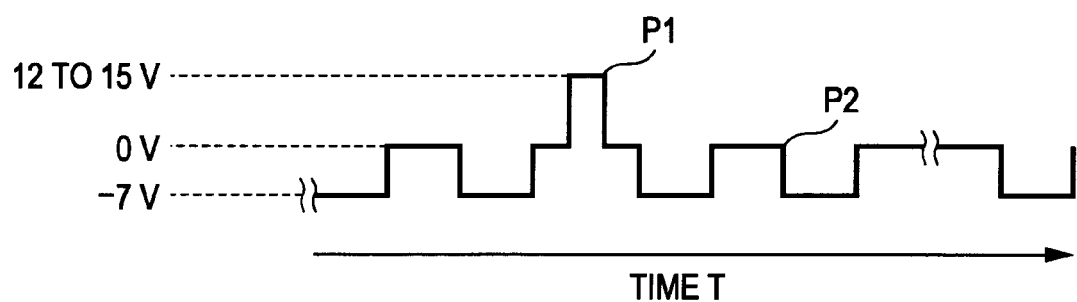
FIGS. 5A and 5B are diagrams illustrating waveforms of driving pulses used for describing the operation and driving method of the invention.
Figure 5B:
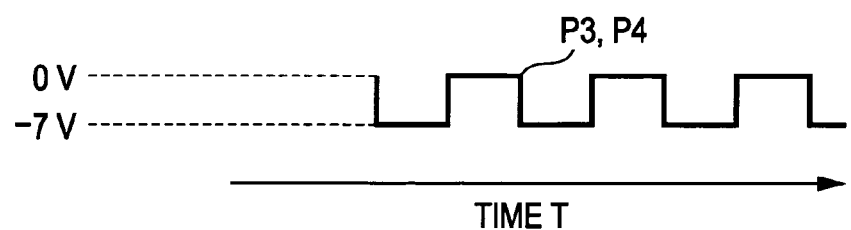

Next, the operation and the driving method of the solid-state image capturing apparatus 31 according to the first embodiment will be described. A three-value driving pulse, a plus voltage +V serving as a reading voltage, 0V and a minus voltage −V for vertical transfer, is applied to the vertical transfer electrode 35 serving as the reading electrode. As in one detailed example shown in FIG. 5A, a three-value driving pulse, a reading pulse p1 of 12V to 15V, and a repetitive vertical driving pulse p2 of 0V and −7V used for vertical transfer, is applied to the vertical transfer electrode 35. Further, a vertical driving pulse of 0V and a minus voltage −V, which have the same amplitude as that of the vertical driving pulse p2 applied to the vertical transfer electrode 35, for example, vertical driving pulses p3 and p4 of 0V and −7V as shown in FIG. 5B are applied to the vertical transfer electrodes 34 and 36.

After light reception and accumulation period of signal charges to the light sensing unit 2 are completed, the reading pulse p1 is applied to the vertical transfer electrode 35 serving as the reading electrode at the charge reading time point, so that the signal charges accumulated in the light sensing unit 2 are read to a transfer section below the vertical transfer electrode 35 of the vertical transfer register 3 through the charge reading gate unit 7. Thereafter, in the IT type solid-state image capturing apparatus 1, the vertical driving pulses p3, p2 and p4 are respectively applied to the vertical transfer electrodes 34 to 36, and the read signal charges are sequentially transferred to the horizontal transfer register.

In the FIT type solid-state image capturing apparatus 11, for example, high speed driving pulses of 0V and −7V are applied to the vertical transfer electrodes of the vertical transfer register 3 in the image capturing area, and the vertical transfer electrodes of the vertical transfer register 13 of the storage area 12, and the signal charges are accumulated in the storage area 12. Thereafter, the signal charges are sequentially transferred to the horizontal transfer register by application of the constant speed vertical driving pulses p2 to p4 (at a speed relatively lower than the above speed).

According to the embodiment, upon reading of the signal charges from the light sensing unit 2 to the vertical transfer register 3, the following driving operation is performed. That is, a silicon surface local electric field of an edge portion of the vertical transfer electrode 35, which is induced by the thickness of the gate insulating layer 52, the acceptor concentration near the surface of the channel stop regions 41 and 42, and the reading voltage p1, is driven at 60 V/μm or less.

Figure 6:
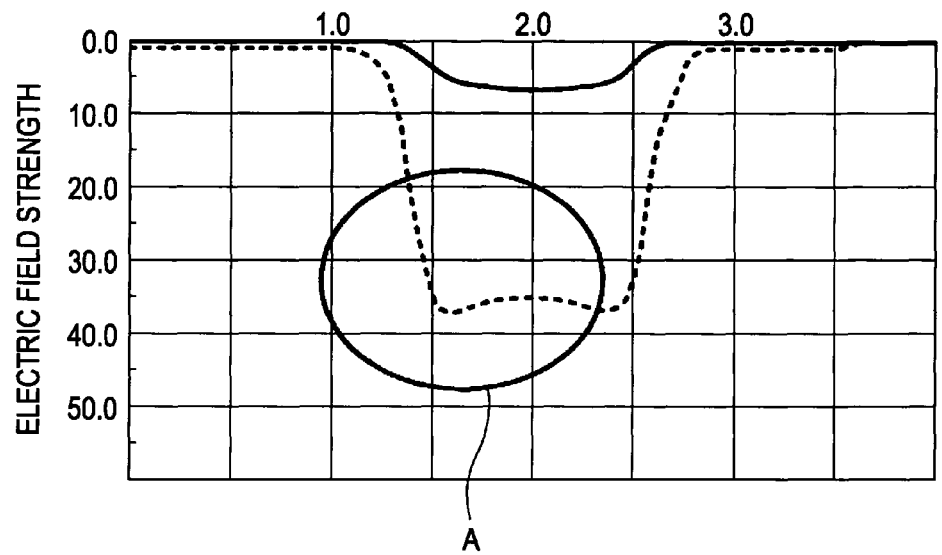
FIG. 6 is a simulation diagram illustrating electric field strength near an edge of a vertical transfer electrode according to a solid-state image capturing apparatus of the invention.
Figure 7:
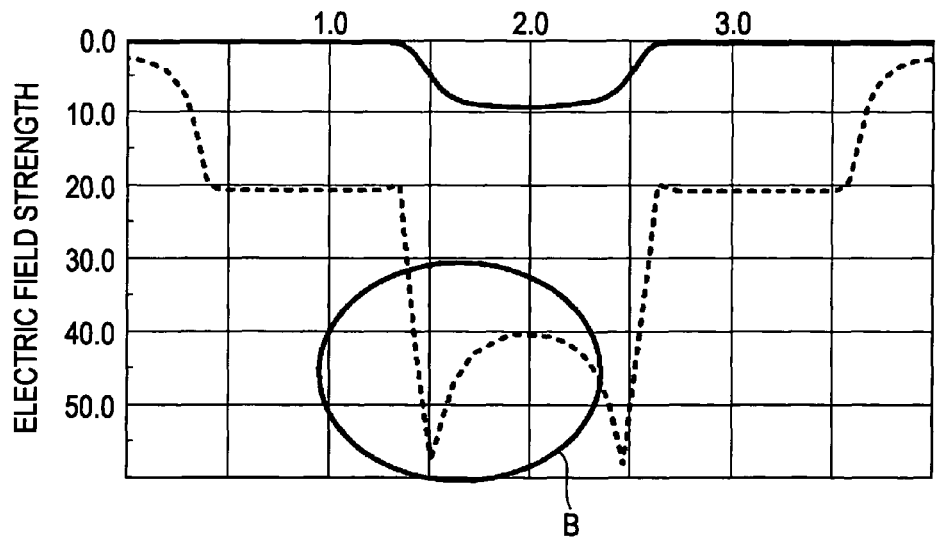
FIG. 7 is a simulation diagram illustrating electric field strength near an edge of a vertical transfer electrode according to a solid-state image capturing apparatus according to the related art.
Figure 11:
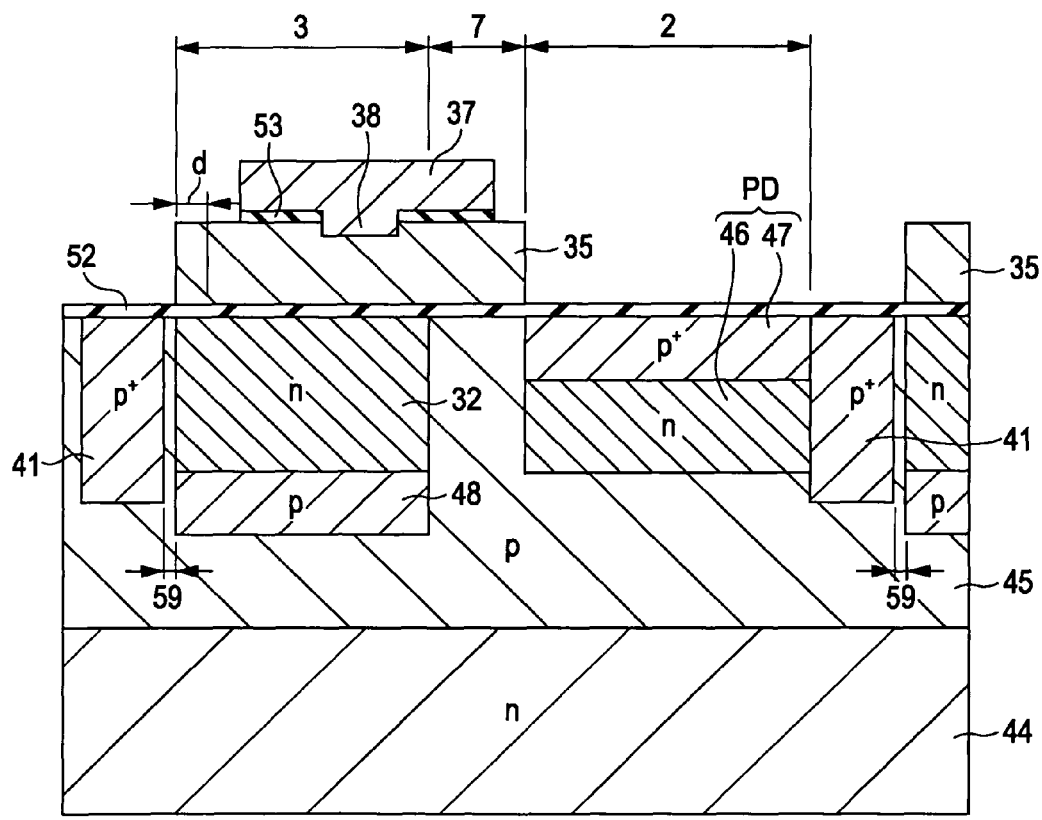
FIG. 11 is a sectional view taken along line XI-XI of FIG. 10.
Figure 12:
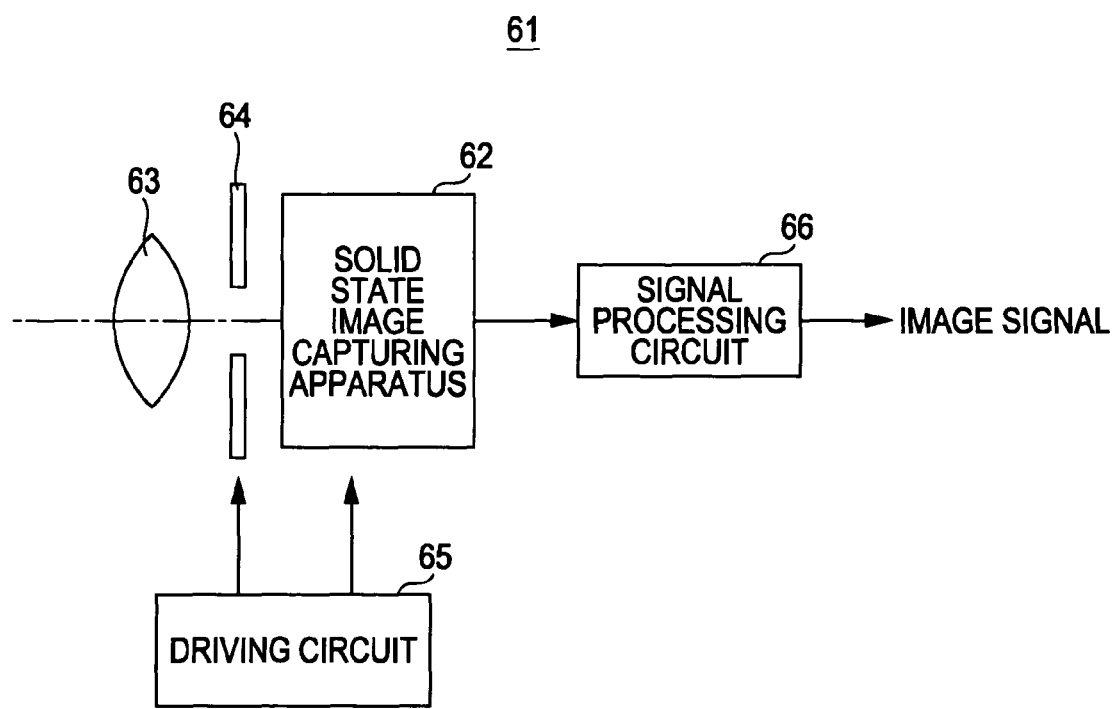
FIG. 12 is a diagram schematically illustrating the configuration of an electronic apparatus according to a fifth embodiment of the invention.

FIGS. 6 and 7 illustrates the state of an electric field of the edge portion of the vertical transfer electrode serving as the reading electrode upon charge reading, which illustrates a comparison result of the embodiment (FIGS. 3 and 4) and the existing configuration (FIGS. 11 and 12). In all cases, when the gate insulating layer as a specimen has a thickness of 60 nm and the reading voltage VT of 15V is applied, electric field strength is calculated. In FIGS. 6 and 7, an absolute value of the electric field strength is increased downward. In FIGS. 6 and 7, the vertical axis denotes the electric field strength and the horizontal axis denotes a dimension of a transverse direction, that is, a dimension of a width direction of the channel stop region of a pixel section. The upper solid line on the graph represents a potential when the reading voltage VT is applied, and the broken line represents an electric field.

FIG. 6 illustrates potential distribution (solid line) and electric field strength distribution (broken line) in a transverse (B-B) section of the vertical transfer register 3 below the electrode 35 of FIG. 3. The curve represents electric field strength distribution (i.e., potential distribution).

Figure 13:
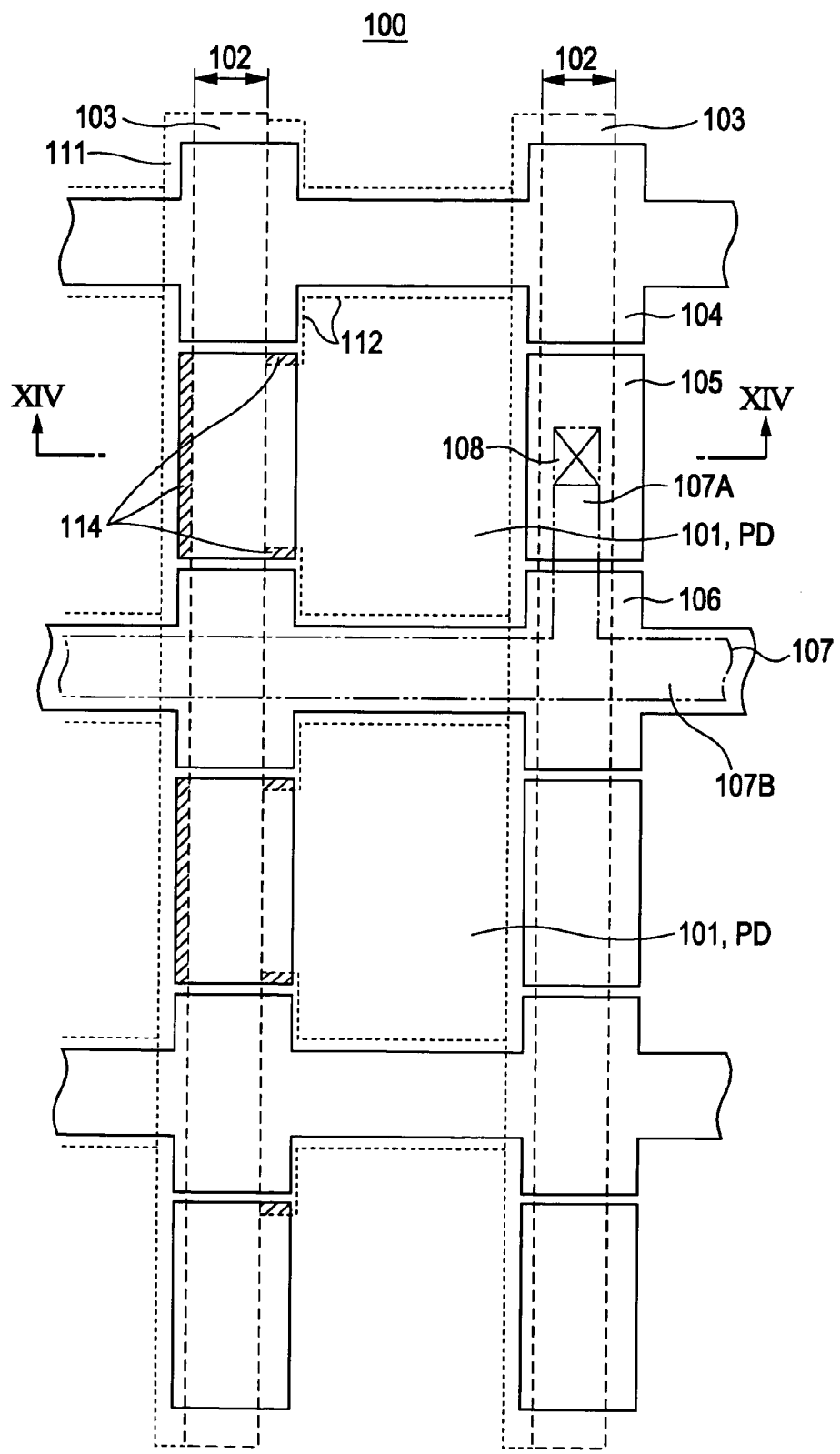
FIG. 13 is a plan view illustrating an outline of main elements of one example of a solid-state image capturing apparatus according to the related art.
Figure 14:
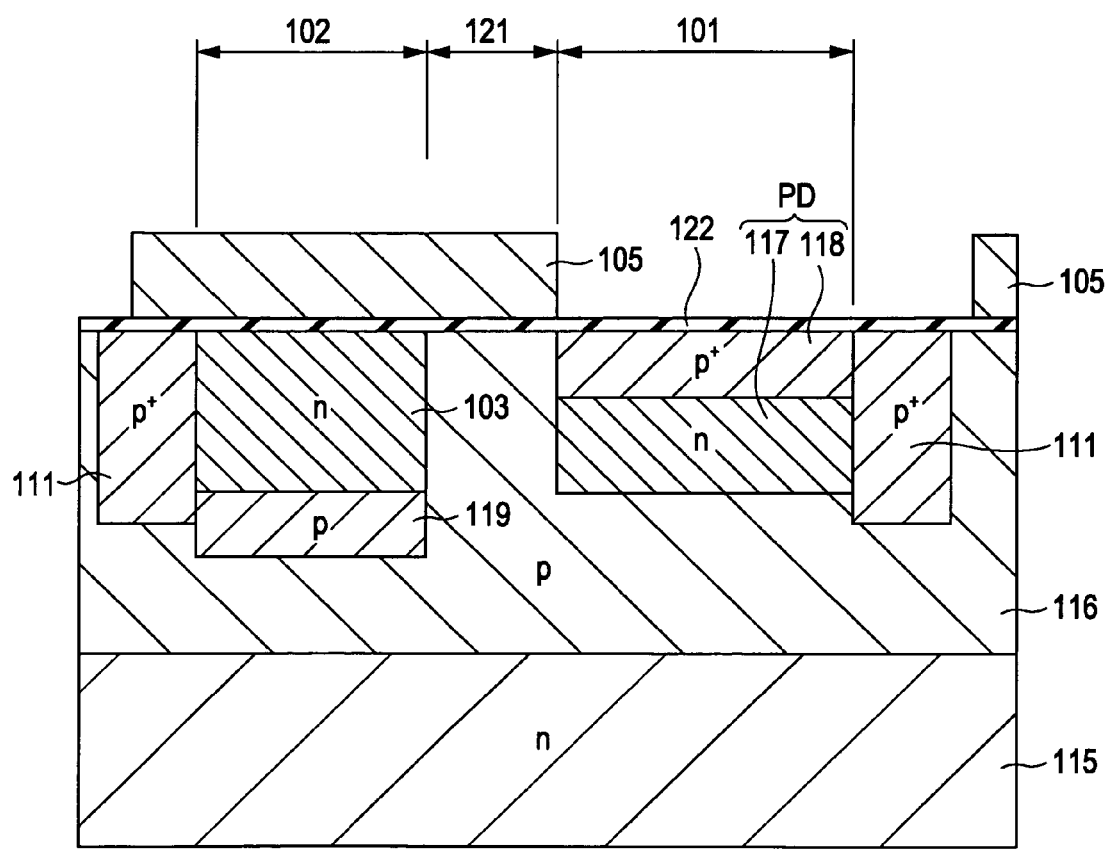
FIG. 14 is a sectional view taken along line XIV-XIV of FIG. 13.
Figure 15:
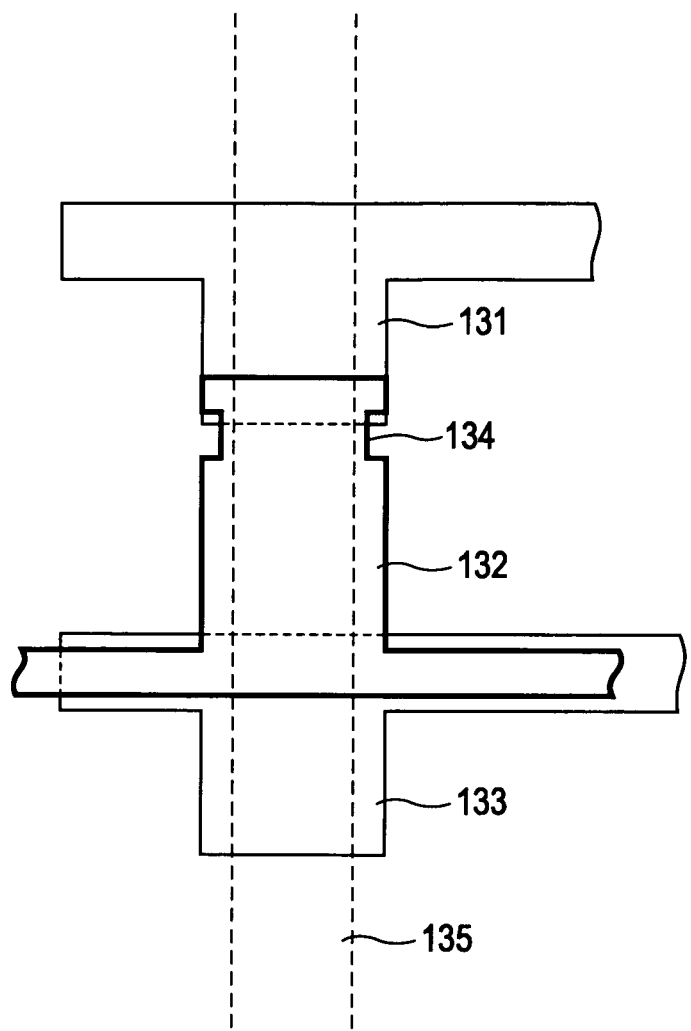
FIG. 15 is a plan view used for describing problems of the related art.

FIG. 7 illustrates potential distribution (solid line) and electric field strength distribution (broken line) in a transverse (A-A) section of the vertical transfer register 102 below the electrode 105 of FIG. 13. The solid line on the graph indicates potential distribution and the broken line represents electric field strength distribution.

In the existing configuration, as shown in region B of FIG. 7, the electric field strength is higher than the center by about 40% due to electric field concentration in the vicinity of an electrode edge. However, in the configuration according to the embodiment, as shown in region A of FIG. 6, increase in the electric field concentration is suppressed to about 10%.

As the size of a pixel cell becomes small, for example, in the case of a 1.5 micron square pixel cell, it is necessary to increase the handling charge amount per unit area of the vertical transfer register, and to set the thickness of the gate insulating layer to about 30 nm. However, in such a case, a target portion, that is, the edge portion of the vertical transfer electrode serving as the reading electrode may have an electric field value exceeding 100 V/μm.

If the electric field value exists in the range of 60 V/μm to 80 V/μm, in a region having a high electric field value in which a band of a semiconductor is bent, excitation of electrons serving as minority carriers to a conduction band occurs by trap assisted band to band tunneling. The electrons generated by the excitation become dark current components of the vertical transfer register or the light sensing unit. In addition, the electrons are accelerated by an electric field near the surface, and injected into the gate insulating layer. A certain amount of the injected electrons are trapped by the gate insulating layer. The trapped electrons modulate the channel potential of the vertical transfer register and make it shallower than the original value. Due to the potential modulation, a potential barrier is formed in the embedded transfer channel region, and an electric field of the transfer direction of signal charges is reduced, so that the charge transfer properties are degraded.

Further, if the electrons are injected into the gate insulating layer, it has been generally known that the interface state of Si—$SiO_2$ interface is increased, resulting in reduction of the SN ratio of the CCD solid-state image capturing apparatus due to the increase in dark current.

In the embodiment, the vertical transfer electrode 35 serving as the reading electrode does not overlap the channel stop regions 41 and 42, so that an electric field between the edge portion of the vertical transfer electrode 35 and the p+ channel stop regions 41 and 42 becomes weak. In the configuration according to the embodiment, even if the gate insulating layer has a thickness of about 30 nm and a 1.5 micron square pixel cell is employed, the electric field value can be set to 60 V/μm or less.

According to the solid-state image capturing apparatus 31 and the driving method thereof based on the above-described first embodiment, the reading voltage VT is applied to the vertical transfer electrode 35 of the vertical transfer register 3, so that the properties thereof can be prevented from being degraded. That is, in the vertical transfer register 3, since the vertical transfer electrode 35 does not overlap the p+ channel stop regions 41 and 42, the electric field concentration between the edge portion of the vertical transfer electrode 35 and the p+ channel stop regions 41 and 42 is prevented when the reading voltage VT is applied. Even if the size of the pixel cell becomes small, a local electric field value between the edge portion of the vertical transfer electrode 35 and the p+ channel stop regions 41 and 42 can be set to 60 V/μm or less, and the electric field concentration therebetween can be prevented.

The electric field concentration is alleviated, so that electron injection into the gate insulating layer of the vertical transfer register 3 from the silicon surface of the channel stop regions 41 and 42 can be prevented. As described above, the electrons injected into and trapped by the gate insulating layer modulate the channel potential of the vertical transfer register, which causes charge transfer degradation of the vertical transfer register. Further, the injected and trapped electrons may become a factor that degrades a breakdown voltage of the gate insulating layer. In this regard, in the embodiment, electron injection to the gate insulating layer 52 is prevented, so that the charge transfer properties of the vertical transfer register 3 can be improved and the breakdown voltage of the gate insulating layer 52 can be prevented from being degraded.

According to the embodiment, the above configuration is employed, so that electrostatic capacitance can be increased by using the gate insulating layer 52 with a thin film, and the vertical transfer register 3 of a high handling charge amount can be realized without deterioration in the reliability.

According to the configuration of the embodiment, due to the application of the reading voltage VT, punch through between a depletion layer of a vertical transfer section immediately below the vertical transfer electrode 35 and a depletion layer of the light sensing unit 2 of pixels adjacent to each other is prevented, so that signal color mixture of the adjacent pixels, that is, color mixture can be prevented.

A pixel cell with a finer structure can be realized by an improvement of punch through characteristics of the adjacent pixels.

By the way, when the vertical transfer electrode serving as the reading electrode is formed to overlap the channel stop region, upon the application of the reading voltage VT to the vertical transfer electrode, the depletion layer of the vertical transfer section immediately below the vertical transfer electrode 35 depletes the channel stop region. In addition, a p type semiconductor region on the surface of a light sensing unit of adjacent pixels is depleted from the transverse direction, so that dark current is generated.

In this regard, according to the embodiment, the dark current generated by such depletion of the p type semiconductor region can be controlled. Reduction of the dark current is an important factor in realizing a high sensitivity camera.

Further, according to the embodiment, the width of the first channel stop region 41 between the vertical transfer register 3 and the P+ semiconductor region 47 on the surface of the light sensing unit 2 of adjacent pixels is narrowed, so that a CCD solid-state image capturing apparatus having a fine pixel structure can be realized.

Since the width of the first channel stop region 41 can be narrowed, when a light blocking layer is formed on other portions except for the light sensing unit, the light blocking layer can coat portions on the first channel stop region 41, so that it is possible to realize a CCD solid-state image capturing apparatus having superior smear characteristics and F value sensitivity characteristics.

Second Embodiment

[Configuration Example of Solid-State Image Capturing Apparatus]

Figure 8:
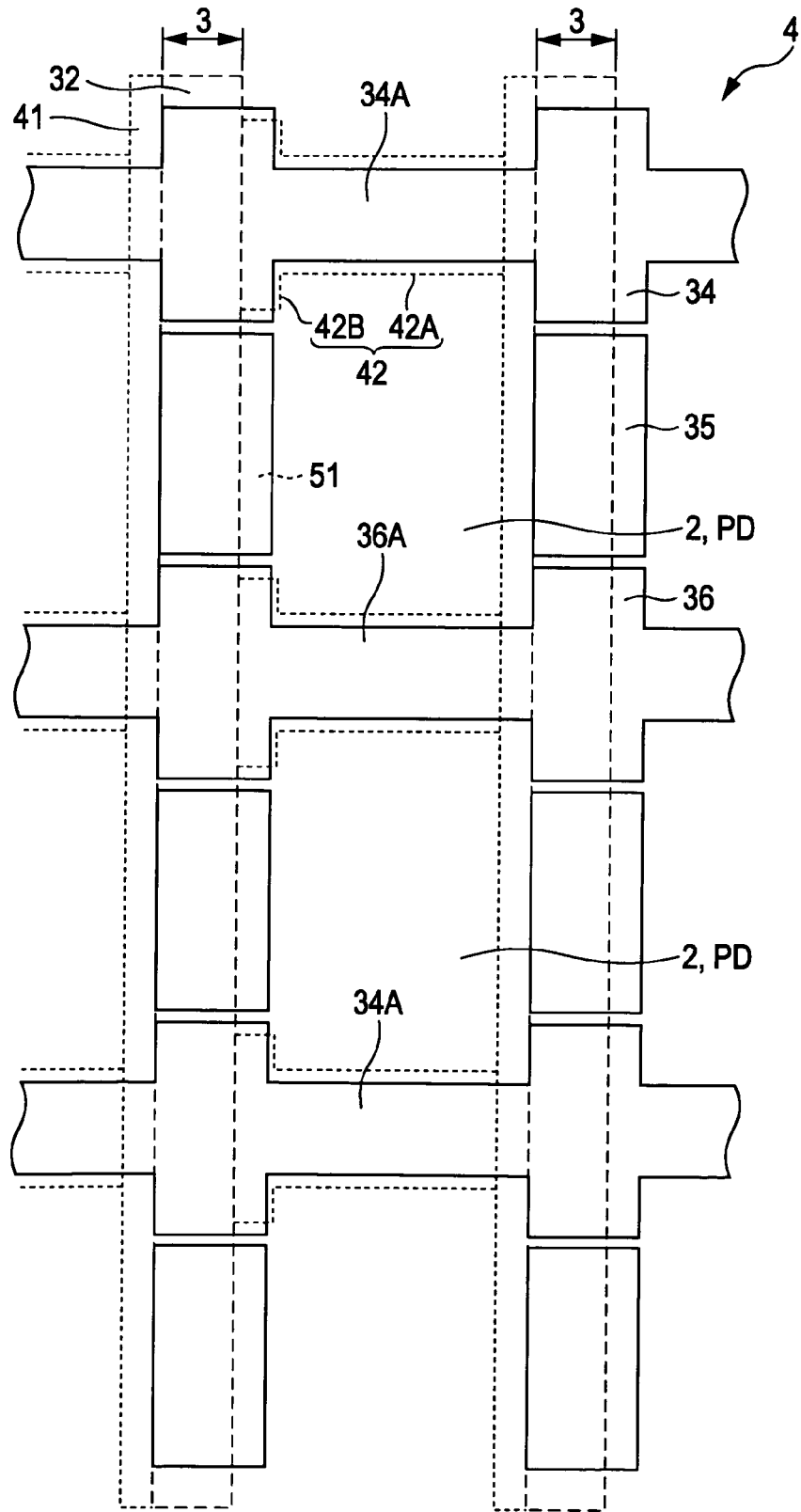
FIG. 8 is a plan view illustrating an outline of main elements of a solid-state image capturing apparatus according to a second embodiment of the invention.

FIG. 8 illustrates a solid-state image capturing apparatus according to an embodiment of the invention, that is, a CCD solid-state image capturing apparatus according to the second embodiment. FIG. 8 is a plan view of main elements in an image capturing region. Similarly to the first embodiment as described above, the solid-state image capturing apparatus 55 according to the embodiment includes an image capturing region 4 configured by a plurality of light sensing units 2, which are two-dimensionally arranged in a matrix formation, and a plurality of vertical transfer registers 3. Each light sensing unit 2 is formed by a photodiode (PD) serving as a photoelectric conversion unit. Each vertical transfer register 3 includes an embedded transfer channel region 32 and a plurality of vertical transfer electrodes 34 to 36 formed above the embedded transfer channel region 32 while interposing a gate insulating layer therebetween. In the embodiment, the three vertical transfer electrodes 34 to 36 correspond to one light sensing unit 2, and are each formed by a single layer polysilicon film.

Among the three vertical transfer electrodes 34 to 36, the upper and lower vertical transfer electrodes 34 and 36 sandwiching the central vertical transfer electrode 35 are continuously formed in the horizontal direction through connection electrodes 34A and 36A between the light sensing units 2, which are adjacent to in the vertical direction, such that electrodes corresponding to the vertical transfer registers 3 are connected to each other. Although not illustrated in FIG. 8, similarly to the first embodiment, the central vertical transfer electrode 35 independently formed in an island shape is connected to a connection interconnection 37. The central vertical transfer electrode 35 serves as a reading electrode of a charge reading gate unit 7.

In order to be provided in parallel to the embedded transfer channel region 32 while making contact with the embedded transfer channel region 32, a first channel stop region 41 for separating pixels adjacent to each other in the horizontal direction is formed by a p+ semiconductor region. Further, a second channel stop region 42 for separating pixels adjacent to each other in the vertical direction is formed by the p+ semiconductor region.

In the embodiment, all the plurality of vertical transfer electrodes 34 to 36 are formed not to overlap the first channel stop region 41. The vertical transfer electrodes 34 to 36 are formed to have the same electrode width. That is, among the three vertical transfer electrodes 34 to 36, an electrode section corresponding to the upper and lower vertical transfer electrodes 34 and 36 and the light sensing unit 2 is formed to have the same electrode width as that of the central vertical transfer electrode 35. In addition, only the vertical transfer electrode 35 serving as the reading electrode is formed not to overlap a second channel stop region 42. That is, the second channel stop region 42 is formed not to overlap the vertical transfer electrode 35.

Since other configurations are identical to those described in the first embodiment, detailed description will be omitted. In FIG. 8, the same reference numerals are used to designate elements corresponding to FIG. 3.

Since the operation and the driving method of the CCD solid-state image capturing apparatus 55 according to the second embodiment are identical to those described in the first embodiment, detailed description will be omitted.

According to the solid-state image capturing apparatus 55 and the driving method thereof based on the second embodiment, the vertical transfer electrode 35 serving as the reading electrode does not overlap the first and second channel stop regions 41 and 42. Thus, when a reading voltage VT is applied to the vertical transfer electrode 35, local electric field concentration between the edge portion of the vertical transfer electrode 35 and the channel stop regions 41 and 42 is alleviated. As a result, effects similar to the effects described in the first embodiment can be obtained, that is, electron injection into the gate insulating layer of the vertical transfer register 3 from the silicon surface of the channel stop regions 41 and 42 is prevented, color mixture is prevented, dark current is prevented, or the like.

Third Embodiment

[Configuration Example of Solid-State Image Capturing Apparatus]

Figure 9:
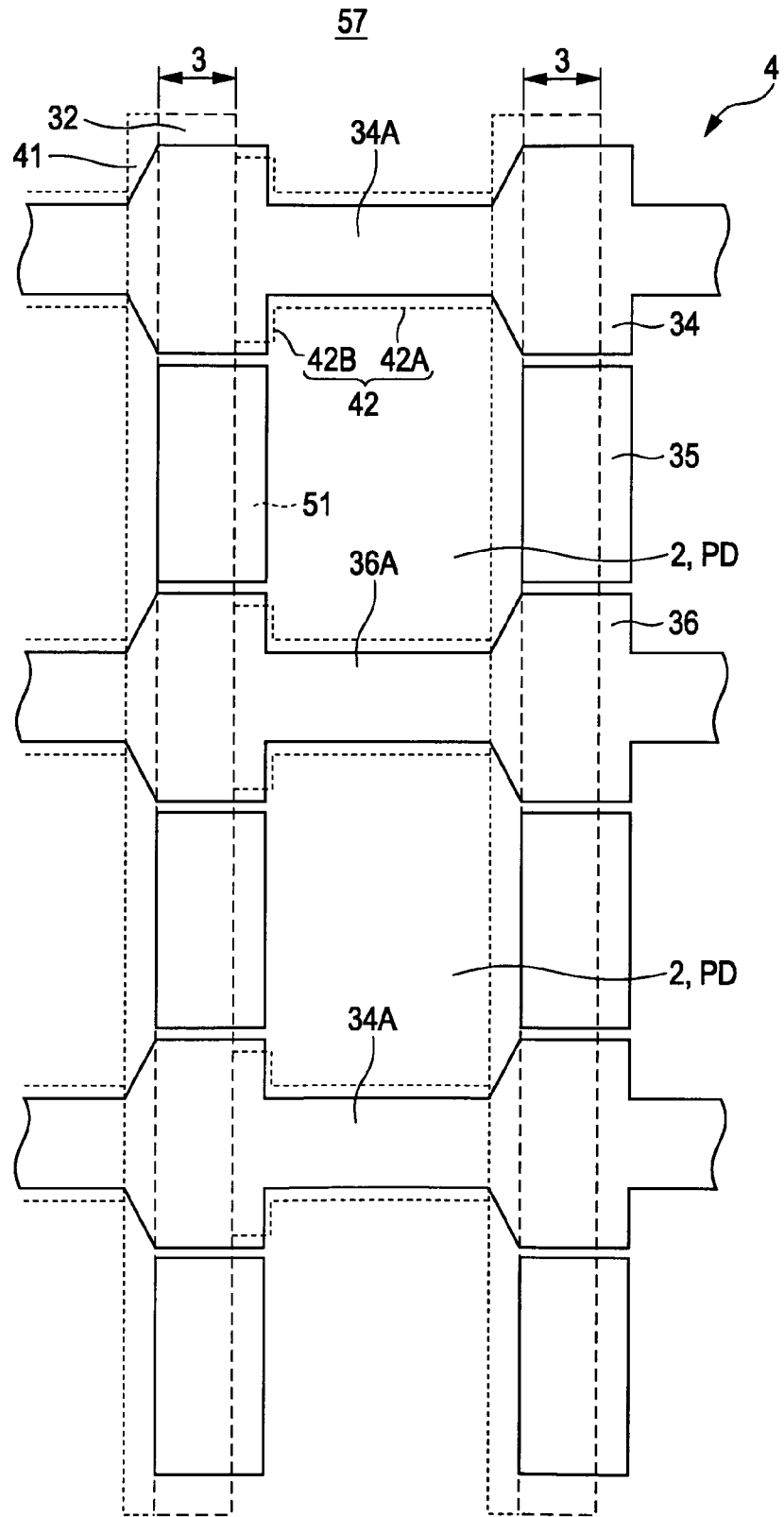
FIG. 9 is a plan view illustrating an outline of main elements of a solid-state image capturing apparatus according to a third embodiment of the invention.

FIG. 9 illustrates a solid-state image capturing apparatus according to an embodiment of the invention, that is, a CCD solid-state image capturing apparatus according to the third embodiment. FIG. 9 is a plan view of main elements in an image capturing region. Similarly to the first embodiment as described above, the CCD solid-state image capturing apparatus 57 according to the embodiment includes an image capturing region 4 configured by a plurality of light sensing units 2, which are two-dimensionally arranged in a matrix formation, and a plurality of vertical transfer registers 3. Each light sensing unit 2 is formed by a photodiode (PD) serving as a photoelectric conversion unit. Each vertical transfer register 3 includes an embedded transfer channel region 32 and a plurality of vertical transfer electrodes 34 to 36 formed above the embedded transfer channel region 32 while interposing a gate insulating layer therebetween. In the embodiment, the three vertical transfer electrodes 34 to 36 correspond to one light sensing unit 2, and are each formed by a single layer polysilicon film.

Among the three vertical transfer electrodes 34 to 36, the upper and lower vertical transfer electrodes 34 and 36 sandwiching the central vertical transfer electrode 35 are continuously formed in the horizontal direction through connection electrodes 34A and 36A between the light sensing units 2, which are adjacent to in the vertical direction, such that electrodes corresponding to the vertical transfer registers 3 are connected to each other. Although not illustrated in FIG. 8, similarly to the first embodiment, the central vertical transfer electrode 35 independently formed in an island shape is connected to a connection interconnection 37. The central vertical transfer electrode 35 serves as a reading electrode of a charge reading gate unit 7.

In order to be provided in parallel to the embedded transfer channel region 32 while making contact with the embedded transfer channel region 32, a first channel stop region 41 for separating pixels adjacent to each other in the horizontal direction is formed by a p+ semiconductor region. Further, a second channel stop region 42 for separating pixels adjacent to each other in the vertical direction is formed by the p+ semiconductor region.

In the embodiment, among the plurality of vertical transfer electrodes 34 to 36, the vertical transfer electrode 35 serving as the reading electrode does not overlap the first and second channel stop regions 41 and 42. That is, the second channel stop region 42 is formed not to overlap the vertical transfer electrode 35. The remaining upper and lower vertical transfer electrodes 34 and 36 are formed to overlap the first and second channel stop regions 41 and 42. In portions of the vertical transfer electrodes 34 and 36, which correspond to the light sensing units 2, side edges of the portions overlapping the first channel stop region are inclined such that widths of the vertical transfer electrodes 34 and 36 are gradually narrowed. That is, widths of the upper and lower vertical transfer electrodes 34 and 36, which do not serve as the reading electrode, are uniform at portions facing the vertical transfer electrode 35 serving as the reading electrode. In order to gradually widen the electrode widths from these portions, the vertical transfer electrodes 34 and 36 are inclined. In other words, the vertical transfer electrodes 34 and 36 are inclined from the portions, which correspond to the boundaries between the first channel stop region 41 of the connection electrodes 34A and 36A and the light sensing unit 2, such that the widths of end edges thereof facing the vertical transfer electrode 35 are identical to the width of an end edge of the vertical transfer electrode 35. The end edges of the vertical transfer electrodes 34 to 36 with respect to the light sensing unit 2 are formed on the same line. Since other configurations are identical to those described in the first embodiment, detailed description will be omitted. In FIG. 9, the same reference numerals are used to designate elements corresponding to FIG. 3.

Since the operation and the driving method of the solid-state image capturing apparatus 57 according to the third embodiment are identical to those described in the first embodiment, detailed description will be omitted.

According to the solid-state image capturing apparatus 57 and the driving method thereof based on the third embodiment, the vertical transfer electrode 35 serving as the reading electrode does not overlap the first and second channel stop regions 41 and 42. Thus, when a reading voltage VT is applied to the vertical transfer electrode 35, local electric field concentration between the edge portion of the vertical transfer electrode 35 and the channel stop regions 41 and 42 is alleviated. As a result, effects similar to the effects described in the first embodiment can be obtained, that is, electron injection into the gate insulating layer of the vertical transfer register 3 from the silicon surface of the channel stop regions 41 and 42 is prevented, color mixture is prevented, dark current is prevented, or the like.

Fourth Embodiment

[Configuration Example of Solid-State Image Capturing Apparatus]

Figure 10:
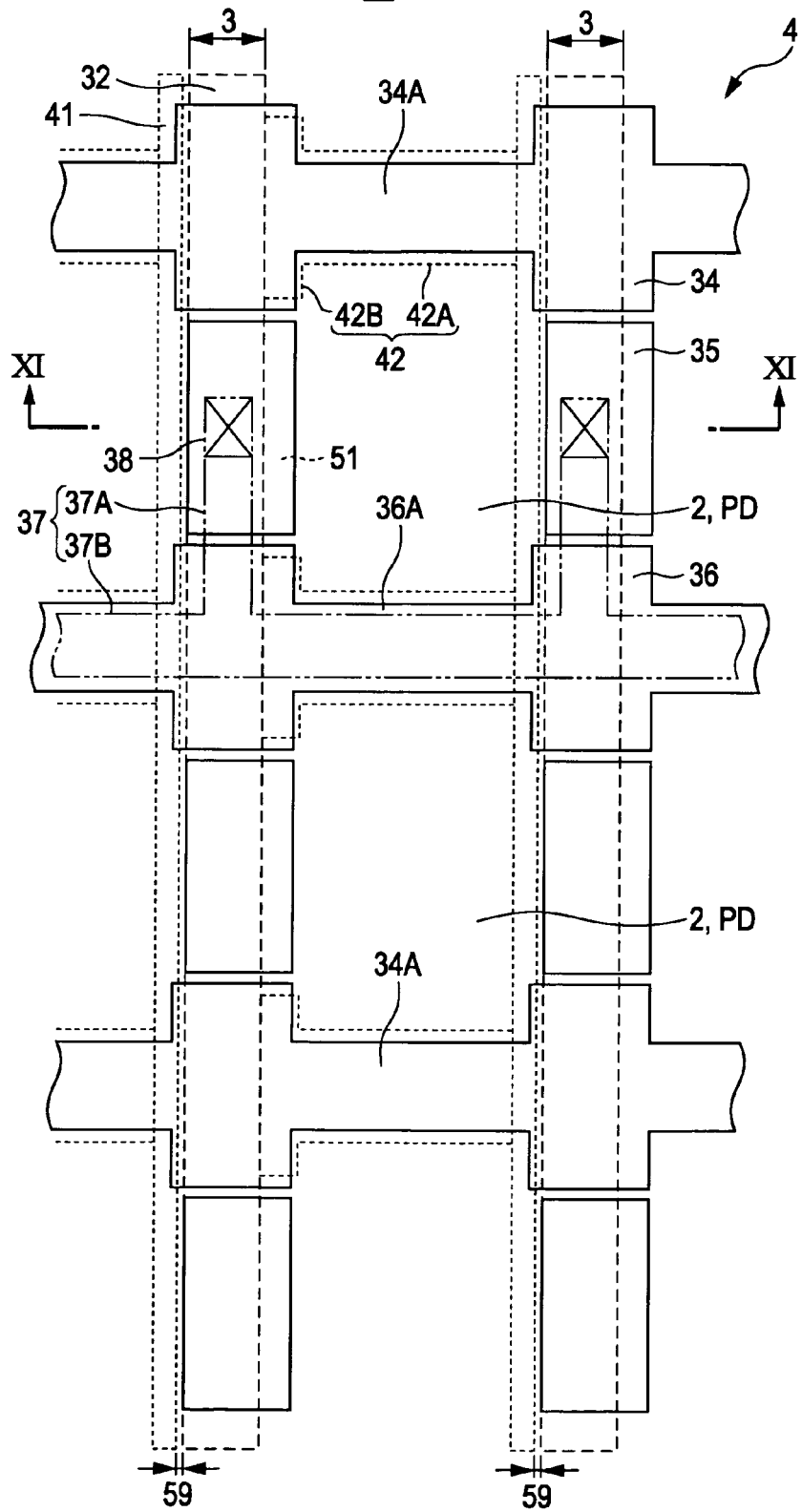
FIG. 10 is a plan view illustrating an outline of main elements of a solid-state image capturing apparatus according to a fourth embodiment of the invention.

FIGS. 10 and 11 illustrates a solid-state image capturing apparatus according to an embodiment of the invention, that is, a CCD solid-state image capturing apparatus according to the fourth embodiment. FIG. 10 is a plan view of main elements in an image capturing region and FIG. 11 is a sectional view taken along line XI-XI of FIG. 10. Similarly to the first embodiment as described above, the CCD solid-state image capturing apparatus 58 according to the embodiment includes an image capturing region 4 configured by a plurality of light sensing units 2, which are two-dimensionally arranged in a matrix formation, and a plurality of vertical transfer registers 3. Each light sensing unit 2 is formed by a photodiode (PD) serving as a photoelectric conversion unit. Each vertical transfer register 3 includes an embedded transfer channel region 32 and a plurality of vertical transfer electrodes 34 to 36 formed above the embedded transfer channel region 32 while interposing a gate insulating layer therebetween. In the embodiment, the three vertical transfer electrodes 34 to 36 correspond to one light sensing unit 2, and are each formed by a single layer polysilicon film.

Among the three vertical transfer electrodes 34 to 36, the vertical transfer electrodes 34 and 36 sandwiching the central vertical transfer electrode 35 are continuously formed in the horizontal direction through connection electrodes 34A and 36A between the light sensing units 2, which are adjacent to in the vertical direction, such that electrodes corresponding to the vertical transfer registers 3 are connected to each other. Although not illustrated in FIG. 8, similarly to the first embodiment, the vertical transfer electrode 35 independently formed in an island shape and serving as a reading electrode is connected to a connection interconnection 37.

In the embodiment, in order to be provided in parallel to the embedded transfer channel region 32 while being spaced from the embedded transfer channel region 32 by a predetermined gap 59, a first channel stop region 41 for separating pixels adjacent to each other in the horizontal direction is formed by a p+ semiconductor region. Further, a second channel stop region 42 for separating pixels adjacent to each other in the vertical direction is formed by the p+ semiconductor region.

Further, in the embodiment, the vertical transfer electrode 35 serving as the reading electrode does not overlap the first and second channel stop regions 41 and 42 and is formed above the embedded transfer channel region 32. That is, an end edge of the vertical transfer electrode 35 with respect to the first channel stop region 41 is formed along an end edge of the embedded transfer channel region 32. The vertical transfer electrodes 34 to 36 may be formed to partially overlap the first channel stop region 41.

Since other configurations are identical to those described in the first embodiment, detailed description will be omitted. In FIG. 8, the same reference numerals are used to designate elements corresponding to FIGS. 3 and 4.

Since the operation and the driving method of the solid-state image capturing apparatus 58 according to the fourth embodiment are identical to those described in the first embodiment, detailed description will be omitted.

According to the solid-state image capturing apparatus 58 of the fourth embodiment, the first channel stop region 41 is separated from the embedded transfer channel region 32 by the gap 59, and the vertical transfer electrode 35 serving as the reading electrode does not overlap the first channel stop region 41. With such a configuration, when a reading voltage VT is applied to the vertical transfer electrode 35, local electric field concentration between the edge portion of the vertical transfer electrode 35 and the channel stop region 41 is further alleviated as compared with the first embodiment. As a result, effects similar to the effects described in the first embodiment can be obtained, that is, electron injection into the gate insulating layer of the vertical transfer register 3 from the silicon surface of the channel stop regions 41 and 42 is prevented, color mixture is prevented, dark current is prevented, or the like.

The configuration of the fourth embodiment, in which the predetermined gap 59 is formed between the first channel stop region 41 and the embedded transfer channel region 32, can be applied to the solid-state image capturing apparatuses according to the second and third embodiments.

Fifth Embodiment

[Configuration Example of Electronic Apparatus]

The solid-state image capturing apparatuses according to the embodiments of the invention, for example, can be applied to an electronic apparatus such as a camera system (e.g., a digital camera or a video camera), a cell phone having an image capturing function, or other apparatuses having an image capturing function.

FIG. 12 illustrates the fifth embodiment in which the solid-state image capturing apparatus is applied to a camera as one example of the electronic apparatus according to the invention. The camera according to the embodiment is exemplified as a video camera capable of photographing a still image and a moving image. The camera 61 according to the embodiment includes a solid-state image capturing apparatus 62, an optical system 63 that guides incident light to a light sensing unit of the solid-state image capturing apparatus 62, a shutter device 64, a driving circuit 65 that drives the solid-state image capturing apparatus 62, and a signal processing circuit 66 that processes an output signal of the solid-state image capturing apparatus 62.

The solid-state image capturing apparatuses according to the previous embodiments as described above are applied to the solid-state image capturing apparatus 62. The optical system (optical lens) 63 allows image light (incident light) of an object to be formed as an image on an image capturing surface of the solid-state image capturing apparatus 62. In this way, signal charges are accumulated in the solid-state image capturing apparatus 62 for a certain period. The optical system 63 may be an optical lens system including a plurality of optical lenses. The shutter device 64 controls a light illumination period and a light blocking period of the solid-state image capturing apparatus 62. The driving circuit 65 supplies a driving signal for controlling a transfer operation of the solid-state image capturing apparatus 62 or a shutter operation of the shutter device 64. The signal transfer of the solid-state image capturing apparatus 62 is performed using the driving signal (timing signal) supplied from the driving circuit 65. The signal processing circuit 66 performs various types of signal processing. A signal-processed image signal is stored in a storage medium such as a memory, or is output to a monitor.

According to the electronic apparatus of the fifth embodiment, even if the size of a pixel cell becomes small, characteristics of the solid-state image capturing apparatus can be prevented from being degraded by the application of the reading voltage, so that a high quality electronic apparatus can be provided. For example, it is possible to provide a camera having a multi-pixel structure and high resolution.

The present application contains subject matter related to that disclosed in Japanese Priority Patent Application JP 2009-014562 filed in the Japan Patent Office on Jan. 26, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A driving method of a solid-state image capturing apparatus, comprising the steps of:
    using the solid-state image capturing apparatus in which one of a plurality of vertical transfer electrodes of a vertical transfer register, to which a reading voltage is applied, is formed not to overlap a channel stop region provided in parallel to a transfer channel region;
    setting a local electric field between an edge portion of the vertical transfer electrode, to which the reading voltage is applied, and the channel stop region to be equal to or less than 60 V/μm, the local electric field being induced by thickness of a gate insulating layer of the vertical transfer register and the reading voltage; and
    reading signal charges from a light sensing unit to the vertical transfer register by applying the reading voltage the vertical transfer electrode.

2. An electronic apparatus comprising:
    an optical lens;
    a solid-state image capturing apparatus; and
    a signal processing circuit that processes an output signal of the solid-state image capturing apparatus,
    wherein the solid-state image capturing apparatus includes:
    a plurality of light sensing units;
    a plurality of vertical transfer registers including a plurality of vertical transfer electrodes, which are formed by a single layer polysilicon film, formed via transfer channel regions and a gate insulating layer having a uniform thickness;
    a first channel stop region provided in parallel to the channel region of the vertical transfer register; and
    a second channel stop region that separates the light sensing units adjacent to each other in a vertical direction,
    wherein, among the vertical transfer electrodes, a vertical transfer electrode serving as a reading electrode is formed without overlapping the first channel stop region and the second channel stop region, and signal charges are read from the light sensing units to the vertical transfer registers when a local electric field of a silicon surface of an edge portion of the vertical transfer electrode serving as the reading electrode is equal to or less than 60 V/μm, the local electric field being induced by the thickness of the gate insulating layer and a reading voltage.

3. A solid-state image capturing apparatus wherein in a plan view of main elements in an image capturing region, the apparatus comprising:
    a column of vertical transfer electrodes between a first channel stop region and a column of photodiodes, a reading electrode of the vertical transfer electrodes being between an upper transfer electrode of the vertical transfer electrodes and a lower transfer electrode of the vertical transfer electrodes; and
    a second channel stop region between one of the photodiodes and another of the photodiodes, said reading electrode in the plan view overlapping neither said first channel stop region nor said second channel stop region,
    wherein said upper transfer electrode in the plan view overlaps said first channel stop region.

4. The solid-state image capturing apparatus according to claim 3, wherein said upper transfer electrode in the plan view does not overlap said first channel stop region.

5. The solid-state image capturing apparatus according to claim 3, wherein said column of the vertical transfer electrodes is a single layer polysilicon film.

6. The solid-state image capturing apparatus according to claim 3, wherein in the plan view, said one of the photodiodes is between an upper connection electrode and a lower connection electrode.

7. The solid-state image capturing apparatus according to claim 6, wherein a width of the said upper transfer electrode increases between said reading electrode and said upper connection electrode.

8. The solid-state image capturing apparatus according to claim 6, further comprising:
    an extension section connected to a contact section of the reading electrode, said extension section being above said reading electrode;
    a band-shaped section connected to said extension section, said band-shaped section being above said upper connection electrode.

9. The solid-state image capturing apparatus according to claim 6, wherein said upper connection electrode is above said second channel stop.

10. The solid-state image capturing apparatus according to claim 6, wherein said upper connection electrode is electrically connected to said upper transfer electrode.

11. The solid-state image capturing apparatus according to claim 6, wherein said lower connection electrode is electrically connected to said lower transfer electrode.

12. An electronic apparatus comprising:
    the solid-state image capturing apparatus according to claim 3;
    an optical lens; and
    a signal processing circuit configured to process an output signal of said solid-state image capturing apparatus.

13. A solid-state image capturing apparatus wherein in a plan view of main elements in an image capturing region, the apparatus comprising:
    a column of vertical transfer electrodes between a first channel stop region and a column of photodiodes, a reading electrode of the vertical transfer electrodes being between an upper transfer electrode of the vertical transfer electrodes and a lower transfer electrode of the vertical transfer electrodes; and a second channel stop region between one of the photodiodes and another of the photodiodes, said reading electrode in the plan view overlapping neither said first channel stop region nor said second channel stop region, wherein said upper transfer electrode in the plan view overlaps said second channel stop region.

14. A solid-state image capturing apparatus wherein in a plan view of main elements in an image capturing region the apparatus comprising:

a column of vertical transfer electrodes between a first channel stop region and a column of photodiodes, a reading electrode of the vertical transfer electrodes being between an upper transfer electrode of the vertical transfer electrodes and a lower transfer electrode of the vertical transfer electrodes; and a second channel stop region between one of the photodiodes and another of the photodiodes, said reading electrode in the plan view overlapping neither said first channel stop region nor said second channel stop region, wherein said column of the vertical transfer electrodes is above a transfer channel region, said transfer channel region being spaced from said first channel stop region by a gap.

15. The solid-state image capturing apparatus according to claim 14, wherein said transfer channel region is in physical contact with said first channel stop region.

16. A solid-state image capturing apparatus wherein in a plan view of main elements in an image capturing region, the apparatus comprising:

a column of vertical transfer electrodes between a first channel stop region and a column photodiodes, a reading electrode of the vertical transfer electrodes being between an upper transfer electrode of the vertical transfer electrodes and a lower transfer electrode of the vertical transfer electrodes; and a second channel stop region between one of the photodiodes and another of the photodiodes, said reading electrode in the plan view overlapping neither said first channel stop region nor said second channel stop region, wherein said column of the vertical transfer electrodes is above a transfer channel region, wherein a signal charge is transferrable from said one of the photodiodes to said transfer channel region when a local electric field of a silicon surface of an edge portion of the reading electrode is equal to or less than 60 V/µm.

17. The solid-state image capturing apparatus according to claim 16, wherein said one of the photodiodes is configured to convert incident light into said signal charge.

18. The solid-state image capturing apparatus according to claim 16, wherein said reading electrode is configured to receive a reading voltage, said reading voltage and a thickness of a gate insulating layer inducing said local electric field.

19. The solid-state image capturing apparatus according to claim 18, wherein said gate insulating layer is below said a column of the vertical transfer electrodes, said gate insulating layer being between said column of the vertical transfer electrodes and said transfer channel region.

\* \* \* \* \*